United States Patent [19]

Ali

[11] Patent Number: 4,988,607
[45] Date of Patent: Jan. 29, 1991

[54] HIGH SPEED PHOTOPOLYMERIZABLE ELEMENT WITH INITIATOR IN A TOPCOAT

[75] Inventor: Mohammad Z. Ali, Woodbury, Minn.

[73] Assignee: Minnesota Mining and Manufacturing Company, St. Paul, Minn.

[21] Appl. No.: 357,908

[22] Filed: May 30, 1989

[51] Int. Cl.$^5$ .............................................. G03C 1/492
[52] U.S. Cl. .................................... 430/271; 430/272; 430/273; 430/961
[58] Field of Search ................ 430/271, 272, 273, 961

[56] References Cited

U.S. PATENT DOCUMENTS

| | | | |
|---|---|---|---|
| 4,250,053 | 2/1981 | Smith | 430/287 |
| 4,332,873 | 6/1982 | Hughes et al. | 430/273 |
| 4,366,218 | 12/1986 | Specht et al. | 430/281 |
| 4,599,299 | 7/1986 | Neiss et al. | 430/273 |

*Primary Examiner*—Brammer Jack P.
*Attorney, Agent, or Firm*—Donald M. Sell; Walter N. Kirn; Mark A. Litman

[57] ABSTRACT

A high speed photopolymerization negative-acting printing plate containing a layer comprising a photosensitized polymerization initiator and polymerizable ethylenically unsaturated compound, exhibits higher speed and good shelf life when at least 20% by weight of the total initiator is situated in an oxygen barrier top coat. Addition of p-substituted-N-disubstituted-anilines to the polymerizable layer gives further improvement in stability.

37 Claims, No Drawings

HIGH SPEED PHOTOPOLYMERIZABLE ELEMENT WITH INITIATOR IN A TOPCOAT

CROSS-REFERENCE TO RELATED CASES

U.S. Pat. Application Ser. No. 151,879 filed Feb. 3, 1988, and entitled "Radiation Crosslinkable Compositions", by Klun, Ali, and Robbins, relates to crosslinkable polymers and oligomers containing poly(ethylenically unsaturated)group-containing components and carboxyl groups that are aqueous solvent dispersible and developable. They are quoted as useful in printing plates.

U.S. Pat. Application Ser. No. 34,065 filed Apr. 2, 1987, on sensitized iodonium salts for addition polymerization discloses and claims the use of sensitizers which are ketones containing julolidinyl moieties in the presence of electron donor compounds which include p-substituted aryldialkylamines; inventors Ubel, Oxman, Palazzotto, and Ali. An application covering the equivalent field for triazine initiators FN 43199 USA 4A, U.S. Pat. Application Ser. No. 272,520 was filed on Nov. 17, 1988; inventors Ali, Busman and Ubel.

U.S. Pat. Application Ser. No. 275,515 filed on Nov. 23, 1988, discloses high speed spectrally sensitized photoinitiator compositions for application to printing plates.

U S. Pat. Application Ser. No. 275,516 filed on Nov. 23, 1988, discloses photopolymerizable compositions incorporating the sensitized initiator system of U.S. Pat. No. 275,515 and printing plates showing advantageous use of the compositions.

BACKGROUND OF THE INVENTION

1. Field of Invention

This invention relates to photopolymerizable compositions, particularly to photopolymerizable printing plate compositions, and more particularly to printing plate compositions which are highly sensitive to visible light and have good shelf-life.

2. Information Disclosure Statement

Photopolymerizable compositions have been used in photosensitive elements, such as printing plates, for a number of years. Most representative of the prior art are compositions disclosed in U.S. Pat. Nos. 3,218,167 and 3,887,450. These compositions are relatively slow, however, and must be exposed in the absence of oxygen. Radiation sensitive elements which are oxygen insensitive have been produced by overcoating the elements with an oxygen barrier layer as disclosed in U.S. Pat No. 3,895,949. These elements nevertheless remain relatively slow and such compositions have been satisfactory only where contact printing of the plate and relatively long time exposures can be tolerated.

Photopolymerizable compositions with higher sensitivity are required for applications such as projection printing plates and laser addressable printing plates. For these applications and particularly for laser addressable printing plates, high speed is essential to keep the exposure time short and also to be able to use low intensity lasers, which are of low cost and are more reliable than the high intensity lasers. For these reasons, various efforts have been carried out to improve the sensitivity of photopolymerizable compositions. Some of the representative patents which disclose high speed photopolymerizable compositions are U.S. Pat. Nos. 4,228,232 (3M); 4,594,310 (Mitsubishi Chem Ind KK); 4,259,432 (Fuji Photo Film); 4,162,162, 3,871,885 and 4,555,473 (Dupont); 4,147,552 (Eastman Kodak) and European Patents No. 109,291 (Fuji Photo Film) and 196,561 (Nippon Oils and Fats) and Belgium Patent No. BE 897,694 (Nippon Oils and Fats).

Usually, however, improved sensitivity has been found to be accompanied by poor stability in storage (loss of sensitivity and/or fog generation). For example, the so called "camera speed" photopolymerizable composition described by Bell and Howell ("Unconventional Imaging Process," E. Brinkman, et al, Focal Press New York, 1978, p. 85; "Imaging Systems," K. I. Jacobson et al, John Willey and Sons, 1982, p. 241) has very high photo speed but has poor shelf-life stability.

To improve the storage stability of photopolymerizable compositions, several thermal polymerization inhibitors have been used. These thermal polymerization inhibitors are well known in the art and are described in many patents and literature, such as, U.S. Pat. Nos. 4,168,982; 4,361,640; 4,198,242; 4,148,658. Although the thermal polymerization inhibitors increase the storage stability of the photopolymerizable compositions, one major drawback of using many of these compounds is the decreased photosensitivity imparted by these compounds. This decreased sensitivity is a major hindrance to the potential applications requiring high sensitivity, such as projection exposure imaging and laser imaging.

It is quite well known in the art that the presence of oxygen inhibits free radical polymerization and for this reason the amount of oxygen should be minimized during exposure to obtain a high speed photopolymerizable system. U.S. Pat. No. 3,458,311 teaches the utility of overcoating the photopolymerizable composition with an oxygen barrier top coat layer. A typical oxygen barrier top coat layer is polyvinyl alcohol or gelatin and the layer is usually coated from aqueous solutions on top of the polymerizable light sensitive layer. After exposure, these barrier layers are removed by washing with aqueous solutions, during or before development.

The oxygen barrier layer may contain other additives, such as polyvinlypyrrolidone/vinyl acetate copolymer, discrete inert particles or beads such as polytrimethylolpropane trimethacrylate (U.S. Pat. No. 4,599,299). Strippable oxygen barrier layers are also known in the prior art. U.S. Pat. Nos. 4,454,218, 3,652,275, and 4,148,658 teach lamination of a polyethylene terephthalate film support to the photopolymerizable layer. After exposure the cover sheet is removed.

Trialkylamines, arylalkylamines including p-substituted-N-disubstituted anilines are well known in the prior art. These compounds are known to act as photopolymerization accelerators. U.S. Pat. No. 4,366,228 lists p-substituted-N-disubstituted anilines as photoseveral activators with ketocoumarin compounds. These compounds also act as activators with other keto compounds, such as thioxanthones, fluorenones ("Polymerization of Surface Coatings," C. G. Roffey, Wiley Interscience Publication, 1982), and 1,2-dicarbonyl compounds (U.S. Pat. No. 3,756,827 Re 28,789; 4,072,424).

Many primary amines and some hindered secondary amines are known to be thermal polymerization inhibitors and photo-stabilizers. Napthylamines and phenothiazine are representative examples of thermal inhibitors (U.S. Pat. No. 4,361,640), whereas hindered piperidines are examples of photo-stabilizers for polymers.

Other suitable thermal polymerization inhibitors known in the art are p-methoxyphenol, 2,6-di-tert-butyl-p-cresol, hydroquinone, alkyl and aryl substituted hydroquinones, tert-butyl-catechol, pyrogallol, β-napthol, p-benzoquinone, p-toluquinone, chloranil, nitrobenzene, dinitrobenzene, dicyclopenta-dienyliron, thiazine dyes, e.g. thionine, thionine blue G, methylene blue B, toluidine blue O and 1,4,4-trimethyl-2,5- diazabicyclo [3,2,2] non-2-ene-N,N-dioxide (U.S. Pat. No. 4,361,640).

SUMMARY OF THE INVENTION

The invention relates to the provision of a highly sensitive photopolymerizable layer assembly with improved storage properties.

The invention also relates to providing increased speed to a photopolymerizable layer assembly comprising an ethylenically unsaturated polymerizable compound, and a free radical producing photoinitiator composition.

A further aspect of the invention is to provide photosensitive printing plates which have high exposure speed while exhibiting good shelf-life, and which are developable with aqueous alkali solutions.

It has been found that highly sensitive, storage stable photopolymerizable layer assemblies can be made by the incorporation of photoinitiator in an oxygen barrier top layer.

The present invention, therefore, provides a layer assembly comprising a substrate having at least two layers over one surface of the substrate. The lower layer (i.e., closest to the substrate) comprises a photopolymerizable composition containing at least one polymerizable compound containing at least one polymerizable ethylenically unsaturated double bond (this includes both monomers and oligomers), and optionally a free radical producing photopolymerization photoinitiator composition. The top layer is an oxygen barrier overcoat, which contains a photoinitiator composition soluble in the barrier layer. A wide range of compounds known in the art as photoinitiators are suitable, but preferred compounds for this invention are diaryliodonium salts, trihalomethyl-s-triazines and other halogenated hydrocarbons (e.g., hydrocarbon groups having photolabile halogens) known in the art to produce free radical polymerization.

The addition of a p-substituted-N-disubstituted aniline to the lower layer further improves the shelf-life.

DISTINGUISHING FROM THE PRIOR ART

Although the art teaches photopolymerizable layers with topcoats incorporating additives such as polyvinylpyrrolidone/vinyl acetate copolymer and discrete inert particles or beads such as poly-trimethylpropane triacrylate (U.S. Pat. No. 4,599,299), none of the art teaches incorporation of free radical producing photoinitiator in the oxygen barrier top coat. Furthermore it is surprising to obtain higher sensitivity with good storage properties by the incorporation of photoinitiator in the oxygen barrier layer. Without limiting the invention, it is suggested that incorporation of photoinitiator in the oxygen barrier layer provides a higher concentration of photoinitiator near the surface of the photopolymerizable composition and this helps in overcoming the detrimental effect of oxygen inhibition (concentration of oxygen is very likely to be higher, near the surface of the photopolymerizable composition).

The improved storage stability without attendant loss of imaging speed, which is imparted by p-substituted-N-disubstituted-anilines in those photopolymerizable compositions, is surprising. U.S. Pat. No. 4,366,228 teaches the utility of these compounds as activators for free radical polymerization in the presence of sensitizing compounds but in the absence of other photoinitiators. Its surprising function of imparting higher storage stability was not disclosed. The previously described copending cases U.S. Pat. Application Ser. No. 34,065 filed Apr. 4, 1987 and U.S. Pat. Application Ser. No. 272,520 filed 11/17/88 disclose ternary photoinitiator systems in which the choice of a component acting as a donor includes p-substituted-N disubstituted-anilines.

DETAILED DESCRIPTION OF THE INVENTION

According to this invention, an improved photopolymerizable layer assembly comprises at least two layers on one surface of a substrate. There is a lower layer adjacent to the substrate and a top layer between the lower layer and the atmosphere. The lower layer comprises (a) at least one ethylenically unsaturated monomer, oligomer or copolymer capable of free radical polymerization, and optionally, (b) a film-forming polymeric binder, (c) a first photoinitiator, (d) a sensitizer, and (e) imaging addenda (e.g., solvents, antistatic agents, coating aids, dyes, stabilizers, fillers, etc.)

The top layer, the oxygen barrier layer, comprises (i) a barrier polymeric binder chosen from those known in the art as providing an oxygen barrier (e.g., polyvinyl alcohol, gelatin, polyvinylpyrolidone)

(ii) a second photoinitiator, the same as or different from the one used in the lower layer, and optionally, (iii) a sensitizer.

As a further option to improve the shelf-life of the assembly the lower layer may contain a compound selected from p-substituted-N- disubstituted anilines.

Of the molar total of photoinitiator compound or compounds present in the assembly, the lower layer contains between 0 and 80 mole percent and the top layer contains between 100 and 20 mole percent of photoinitiator. Preferably the lower layer contains 50 to 70 mole % and the top layer 50 to 30 mole % of photoinitiator in the assembly (at least the two coated layers).

The total photoinitiator present in the assembly is between 1 and 20 weight % of the dried weight of the lower and top layers combined weight.

The amount of p-substituted-N-disubstituted aniline in the lower layer is between 0.2 and 10 weight % of the dry weight of the layer.

The dry coating weight of the lower layer is between 0.3 g/m$^2$ and 9 g/m$^2$, and preferably between 0.5 g/m$^2$ and 3.3 g/m$^2$, and of the top layer between 0.5 g/m$^2$ and 3.3 g/m$^2$.

The sensitizer may be present only in the lower layer or may be divided between the lower and top layers in various ratios to the photoinitiators present. Because the top layer is removed during development of the plate, placing all of the sensitizer in the top layer (in the case when all the photoinitiator is in that layer) gives the advantage that all or at least most of the colored material is removed from the developed plate.

The choice of a different photoinitiator in the top layer from that in the lower layer may be based on the better compatibility (e.g., solubility or dispersibility) of some photoinitiators with the polymers of one layer or the other.

The photoinitator is chosen from compounds which generate free radicals upon exposure to actinic radiation, in the presence of a sensitizer if necessary. Such free radical photoinitiators are materials known in the art, such as "Free-Radical Chemistry", D. C. Nonhebel and J. C. Walton, University Press (1974). Particularly suitable free radical photoinitiators can be selected from many classes of organic compounds including, for example, organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydroazones, mercapto compounds, pyrilium compounds, triarylimidazoles, biimidazoles, haloalkyltriazines, etc. These materials, generally, must have photosensitizers therewith to form a photoinitiator system. Photosensitizers are well known in the art.

Additional references in the art to free radical photoinitiator systems for ethlyenically unsaturated compounds are included in U.S. Pat. No. 3,887,450 (e.g., column 4), U.S. Pat. No. 3,895,949 (e.g., column 7), and U.S. Pat. No. 4,043,810. Preferred photoinitiators are the onium salts as disclosed in U.S. Pat. Nos. 3,729,313, 4,058,400 and 4,058,401. Other desirable photoinitiators are halotriazines as disclosed in U.S. Pat. No. 3,775,113 and biimidazoles disclosed in U.S. Pat. Nos. 4,090,877,and 4,311,783. These references also disclose sensitizers therein. Another good reference to photoinitiator systems is "Light Sensitive Systems," J. Kosar, 1965, J. Wiley and Sons, Inc. especially Chapter 5. Particularly preferred sensitizers for iodonium salts and halogenated triazines are disclosed in U.S. Pat. Application Ser. No. 275,516 filed Nov. 23, 1988.

Preferred photoinitiator compounds are aromatic iodonium salts, trichloromethyl-s-triazines, and other halogenated hydrocarbon compounds.

Aromatic iodonium salts which are suitable as photoinitiators and which also may be incorporated into the oxygen barrier layer may include compounds from U.S. Pat. No. 4,250,053 that are soluble or dispersible in the said oxygen barrier layer.

The general structure of preferred aromatic iodonium salts is:

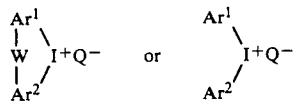

wherein $Ar^1$ and $Ar^2$ are aromatic groups having from 4 to 20 carbon atoms and are preferably selected from phenyl, naphthyl, thienyl, furanyl and pyrazolyl groups, W is selected from a single bond, $=O$, $=S$, $=S=O$, $=C=O$,

$=N-R^{13}$, and $=CR^{11}R^{12}$ where $R^{13}$ is aryl of 6 to 20 carbon atoms, acyl of 2 to 20 carbon atoms, in which $R^{11}$ and $R^{12}$ are selected from hydrogen, alkyl groups of 1 to 4 carbon atoms, Q is any anion, e.g., an acid anion, preferably selected from tetraborate, and halogen-containing complex anions, and more preferably selected from hexafluorophosphate, hexafluoroarsenate, and hexafluoroantimonate.

Preferred iodonium compounds are diphenyl iodonium hexa-fluorophosphate, diphenyliodonium chloride, p-methoxy diphenyl iodonium acetate.

Halogenated hydrocarbon compounds including triazines which are valuable as photoinitiators and which also may be incorporated into the oxygen barrier layer include those compounds from U.S. Pat. No. 3,617,288 and 4,505,793 which are soluble in the said oxygen barrier layer. Preferred compounds are halogenated triazines of the general formula:

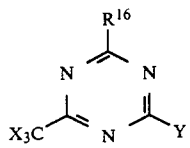

wherein,

X is a halogen atom (preferably chlorine or bromine),

Y is $-CX_3$, $-NH_2$, $-NHR^{15}$, $-NP^{15}{}_2$, or $-OR^{15}$, wherein $R^{15}$ is an alkyl group of 1 to 4 carbon atoms or an aryl group containing 6 to 10 carbon atoms, and $R^{16}$ is $-CX_3$, an alkyl group of 1 to 12 carbon atoms, an aryl group of 6 to 12 carbon atoms, an alkenyl group of 2 to 12 carbon atoms, or an aralkenyl group containing from 8 to 20 carbon atoms.

The top layer is an oxygen barrier layer chosen to be substantially impermeable to oxygen, water-permeable and comprising said barrier polymeric binder selected from macromolecular organic polymers or polymer mixtures that are soluble between about 20° C. and 50° C. in water or in a mixture of water and a water-miscible organic solvent containing at least 50% by volume of water.

Useful macromolecular organic polymers having the characteristics given above are given in U.S. Pat. No. 3,458,311 and include polyvinyl alcohol and its partial esters, ethers and acetals that contain a substantial amount of unsubstituted vinyl alcohol units so that they have the requisite solubility in water. Suitable polymers include 88% to 99% hydrolyzed polyvinyl acetate. Other useful polymers include gelatin, gum arabic, copolymers of vinyl ethers and maleic anhydride , polyvinyl pyrrolidones, high molecular weight, water-soluble polymers of ethylene oxide having an average molecular weight of about 100,000 to 3,000,000 or more, and mixtures of these polymers.

Preferred oxygen barrier layer polymers are polyvinylalcohol, carboxymethylcellulose or mixtures thereof. The choice of photoinitiator for compatibility with the barrier layer may be different from that chosen for the lower photopolymerizable layer.

The free radically polymerizable compounds at least one of which is used in the lower layer, are compounds containing at least one ethylenically unsaturated double bond and may be a monomer, a prepolymer, i.e. a dimer, a trimer, and other oligomers, a mixture thereof, or a copolymer. Suitable examples are the preferred monomers listed in U.S. Pat. Nos. 4,228,232 and 4,476,215. If the free radically polymerizable compound is a monomer, it has preferably 2 to 4 ethylenically unsaturated groups such as acryloyl, methacryloyl, vinyl and allyl. Preferred are compounds having multiple acryloyl and methacryloyl groups, e.g., acrylic esters of low molecular weight polyols, such as trimethylolpropanetriacrylate, pentaerythritol tetraacrylate, and triacrylate, etc. Preferably these monomers have a molecular weight of less then 2,000 and more preferrably less then 1,000. Other suitable free radical polymerizable monomers useful in the compositions of the invention are well known and listed in many patents, e.g., U.S. Pat. No. 3,895,949 and 4,037,021. Preferred monomers are the polyacrylates and polymethacrylate esters of alkanepolyols, e.g., pentaerythritol tetraacrylate, tris(2-acryloxyethyl)-isocyanurate,2-acetoxyethyl methacrylate, tetrahydrofurfurylmethacrylate, 1-aza-5-acryloxymethyl-3,7-dioxabicyclo[3,0,0]octane (ADOZ), bis[4-(2-acryloxyethyl)phenyl]dimethylmethane,diacetone acrylamide, acrylamidoethyl methacrylate.

Free radical polymerizable oligomers with pendant carboxyl groups are known in the art. These can be advantageous in providing dispersibility in aqueous alkali developers. Some representative examples are U.S. Pat. Nos. 3,887,450, 3,448,089, 4,162,274, 4,228,232 and U.S. Pat. Application Ser. No. 151,879 filed Feb. 3, 1988. The most preferred oligomers are found in the latter two references. Controlling the number of acid groups on the oligomer is an effective way of controlling the bondability of the composition to the substrate after photoinitiated reaction. With increasing acid concentration, the composition is more easily removed in development. A wide range of acid contents can be used depending on the performance characteristics desired in the final product.

A film-forming polymeric binder may be added to the composition of the lower layer and in most cases it is advantageous to do so. Indeed where the free radically polymerizable compound is tacky or free flowing it is often imperative to add a polymeric binder. A wide range of suitable binders is known in the art for photopolymerization compositions and suitable examples may be found in U.S. Pat. Nos. 4,228,232 and 4,476,215, including polyvinylacetals, polyvinylbutyral, poly(vinyl methylether), polyvinylalcohol, hydroxyalkylcellulose, polyamides, polyvinylacetate, polyvinylacetate-polyvinylchloride copolymers, polyethyleneoxides, polyacrylates, and polymethacrylates.

Suitable sensitizers include compounds in the following categories: ketones, coumarin dyes (e.g., ketocoumarins), xanthene dyes, 3H-xanthen-3-one dyes, acridine dyes, thiazole dyes, thiazine dyes, oxazine dyes, azine dyes, aminoketone dyes, methines and polymethines, porphyrins, aromatic polycyclic hydrocarbons, p-substituted aminostyryl ketone compounds, aminotriaryl methanes, merocyanines, squarylium dyes and pyridinium dyes. Ketones (e.g., monoketones or alpha-diketones), ketocoumarins, aminoarylketones, p substituted aminostyryl ketone compounds, merocyanines, and aromatic polycyclic hydrocarbons are preferred sensitizers. For applications requiring deep cure (e.g., cure of highly-filled composites), it is preferred to employ sensitizers having an extinction coefficient below about 1000, more preferably below about 100, at the desired wavelength of irradiation for photopolymerization.

By way of example, a preferred class of ketone sensitizers has the formula:

where X is CO or $CR^1R^2$, where $R^1$ and $R^2$ can be the same or different, and can be hydrogen, alkyl, alkaryl or aralkyl, b is zero or 1, and A and B can be the same or different and can be substituted (having one or more non-interfering substitutents) or unsubstituted aryl, alkyl, alkaryl, or aralkyl groups, or together A and B can form a cyclic structure which can be a substituted or unsubstituted cycloaliphatic, aromatic, heteroaromatic or fused aromatic ring.

Suitable ketones of the above formula include monoketones (b=O) such as 2,2-, 4,4- or 2,4-dihydroxybenzophenone, di-2-pyridyl ketone, di-2-furanyl ketone, di2-thiophenyl ketone, benzoin, fluorenone, chalcone, Michler's ketone, 2-fluoro-9-fluorenone, 2-chlorothioxanthone, acetophenone, benzophenone, 1- or 2-acetonaphthone, 9-acetylanthracene, 2-, 3-, or 9-acetylphenanthrene, 4-acetylbiphenyl, propiophenone, n-butyrophenone, valerophenone, 2-, 3- or 4-acetylpyridine, 3-acetylcoumarin and the like. Suitable diketones include araklydiketones such as anthraquinone, phenanthrenequinone, o-, m- and p-diacetylbenzene, 1,3-,1,4-, 1,5-, 1,6- 1,7- and 1,8-diacetylnaphthalene, 1,5-, 1,8- and 9,10-diacetylanthracene, and the like. Suitable betadiketones (b=1 and x=CO) include 2,3-butanedione, 2,3-pentanedione, 2,3-hexanedione, 3,4-hexanedione, 2,3-heptanedione, 3,4-heptanedione, 2,3-octanedione, 4,5-octanedione, benzil 2,2'-3,3,and 4,4,-dihydroxybenzil, furil, di-3,3,-indolylethan 2,3-bornanedione (camphorquinone), biacetyl, 1,2-cyclohexanedione, 1,2-naphthoquinone, acenaphthaquinone, and the like.

Preferred ketocoumarins and p-substituted aminostyryl ketone compounds are listed in Table II in copending U.S. Pat. Application Ser. No. 34,065. Preferred merocyanine dyes are listed in U.S. Pat. No. 3,729,313.

The compositions of the invention can be exposed and thereby cured using a variety of methods. It is convenient to employ light sources that emit ultraviolet or visible light such as quartz halogen lamps, tungsten-halogen lamps, mercury lamps, Xenon and Mercury/Xenon lamps, plasma arcs, light emitting diodes and lasers. In general, heat will accelerate cure.

The p-substituted-N-disubstituted anilines which may be added to the lower layer to further improve the shelf-life are selected from those with the general structure (1)

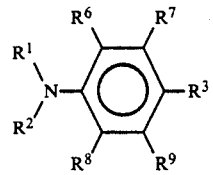

wherein, $R^1$ and $R^2$ are the same or different and are each alkyl containing from 1 to 12 carbon atoms, or together with a nitrogen atom they form one or more hetrocyclic rings having from 5 to 10 nuclear atoms, $R^3$ is the group —$COOR^4$ or the group —(C=O)—$R^5$, $R^4$ is H, alkyl, hydroxyalkyl, carboxyyalkyl, aralkyl, or aryl, where alkyl has from 1 to 15 carbon atoms, and aryl is phenyl or naphthyl, $R^5$ is H, alkyl group containing from 1 to 4 carbon atoms, phenyl group, or naphthyl group, $R^6$, $R^7$, $R^8$, $R^9$ are independently H, alkyl group, hydroxy, alkoxy group, halogen, cyano, or $R^6$ and $R^7$ together or $R^8$ and $R^9$ together may independently form cyclic structures containing up to 8 ring atoms.

The photopolymerizable composition of the invention containing the above-described ethylenic compound and photosensitizer-photoinitiator system may further contain, if desired, known additives such as thermal polymerization inhibitors, plasticizers, coloring agents, and surface lubricants (U.S. Pat. No. 4,228,232).

Substrates for the layer assembly may be chosen from a wide variety of materials according to the end purpose of the photopolymerizable layer assembly. Thus for printing plates grained and anodized aluminum sheet may be used; for color proofing materials clear polymer substrates may be used. In general substrates chosen to be nonpermeable to oxygen are preferred such as metals, polymers, and treated papers.

The polymerizable composition of the present invention are particularly useful in presensitized printing plate, and color proofing systems. The high speed of the compositions and yet high storage stability are very desirable for commercialization of projection exposure imaging systems and particularly imaging systems based on exposure by laser scanning techniques.

EXAMPLES

Example 1

This example demonstrates the advantage of photoinitiator in the top coat in the presence of different sensitizers and stabilizers.

The following stock solution was prepared:

| | |
|---|---|
| 1. Azeotrope (72% n-propanol, 28% water w/w) | 27.6 g |
| 2. Pentaerythritol tetraacrylate (SR-295 Sartomer Co.) | 1.0 g |
| 3. Carboxyl substituted urethane oligomer (61% in methylethylketone) (substantially P-11 from U.S. Pat. No. 4,228,232) | 1.4 g |
| 4. Triethylamine | 0.07 g |
| 5. Klucell M (1.5% in Azeotrope) Hydroxypropylcellulose from (Hercules) | 12.3 g |
| 6. Millbase (Sunfast Blue and Formvar 12/85, 1:2; 13.7% solids in azeotrope) | 2.0 g |

The carboxyl substituted urethane oligomer is similar to the oligomer P-II disclosed in U.S. Pat. No. 4,228,232, and was made by the same preparative route. The oligomer in this Example is characterized as having a molecular weight of 4300, a carboxy equivalent weight of 1100, and an acrylate equivalent weight of 700. The amount of triethylamine was just sufficient to neutralize the carboxy groups of the urethane oligomer.

To 5 g of the stock solution was added 3 or 6 mg (as indicated) of sensitizer, 20 mg of $Ph_2I^+PF_6^-$, and where applicable 6 mg of stabilizer. The solution was then coated with wire wound rods onto grained and anodized aluminum at wet coating weights of 100-200 mg/ft$^2$ (1.075-2.15 g/m$^2$) and dried at 150° F. (65.6° C.) for 2 minutes.

In those samples where the plate was top coated, 5% aqueous polyvinyl alcohol solutions were used, and where indicated in Table 1, the solutions contained 0.25% of $Ph_2I^+PF_6^-$ and a small amount of inert surfactant (Triton X-100 of Rohm & Haas, 0.03%) as a coating aid was applied at a dry coating weight of 100-200 mg/ft$^2$ (1.075-2.15 g/m$^2$). The dried samples were exposed through a √2 transmission factor increment, 21 step Stouffer sensitivity guide for 2 sec. with a 16,000 foot candle (172,224 lux) tungsten light source at 10 inches (25 cm) (3M Model 70 light source). The exposed plates were developed with an aqueous solution of 4% n-propanol, 2% sodium metasilicate and 0.06% Dowfax ® 2Al surfactant (Dow Chemical Company). Table 1 shows the polymer retained according to the number of steps after exposure and development.

The step values (solid) indicate the exposure level at which the developed image density can no longer be differentiated from the background and is believed to be cured to the desired level. Absolute sensitivity thresholds of some of the samples were also measured by exposing with a monochromatic light source of wavelength 488 nm. Table 2 gives these results. The lamp output was measured by a radiometer. For accelerated aging tests, the coated plates were covered with black paper and kept in an oven set at 140° F. (60° C.) for 3 days. After allowing to cool to room temperature, the samples were exposed and developed as above.

In Table 1 the samples 1 and 2 show the results obtained with state of the art topcoat and no stabilizer. Samples 3 to 5 demonstrate that antioxidants commonly used in the art to increase speed or to stabilize these materials, in fact produce a worsening of the stability of our materials. However samples 6 to 9 using p-substituted aryldialkylamines give some improvement. The use of $Ph_2I^+PF_6^-$ in the topcoat in samples 10 to 12 shows improvement over the use of a stabilizer. In samples 13 and 14 the use of such a topcoat with a stabilizer is shown to give a dramatic improvement in stability with increase in speed.

TABLE 1

| | | | | Sensitivity in Steps | |
|---|---|---|---|---|---|
| Sample | Sensitizer | Stabilizer | Top Coat | Fresh | Accelerated Aging |
| 1 | I | None | PVA | 11 | 9 |
| 2 | II | None | PVA | 11+ | 9 |
| 3 | I | A | PVA | 11 | 5 |
| 4 | I | B | PVA | 11 | 5 |
| 5 | I | C | PVA | 11 | 7 |
| 6 | I | D | PVA | 11 | 10 |
| 7 | I | E | PVA | 11 | 9+ |
| 8 | I | F | PVA | 11 | 9+ |
| 9 | I | G | PVA | 11 | 9 |
| 10 | I | D | PVA +X | 11+ | 10+ |
| 11 | II | None | PVA +X | 12 | 10 |
| 12 | II | E | PVA +X | 12 | 11 |
| 13 | III | None | PVA | 14 | 10 |
| 14 | III | E | PVA +X | 16 | 14 |

PVA = polyvinylalcohol.
X = $Ph_2I^+PF^-_6$, wherein Ph = phenyl

TABLE 2

| Sample | Sensitivity Threshold at 488 nm in ergs/cm$^2$ for Fresh Sample |
|---|---|
| 1 | 3200-4000 |
| 14 | 800-1000 |

Key to sensitizers and stabilizers:
Stablizer
A        SnCl$_2$
B        triphenylphosphine

C

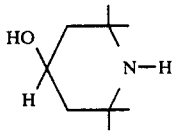

D

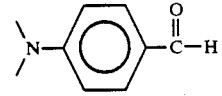

TABLE 2-continued

E: morpholine-N-phenyl-C(=O)-H structure

F: (CH₃)₂N-phenyl-C(=O)-OC₂H₅ structure

G: (CH₃)₂N-phenyl-C(=O)-OH structure

Sensitizer

I  6 mg of  (CH₃)₂N-phenyl-C(=O)-CH=CH-phenyl-N(CH₃)₂

II  3 mg of  (CH₃)₂N-phenyl-CH=CH-C(=O)-CH=CH-phenyl-N(CH₃)₂

III  3 mg of  [julolidine-coumarin sensitizer with diethylamino phenyl group]

Example 2

This example demonstrates the effect of various levels of partitioning of the photoinitiator between a main layer and a topcoat.

To 5 g of the stock solution in Example 1 was added 6 mg of sensitizer I of that example.

Bilayer coatings were made on grained and anodized aluminum as described in Example 1 but with the photoinitiator additions to the two layers as indicated in Table 3. Testing was also carried out as in that example.

TABLE 3

| | Initiators: X = Ph₂I⁺PF₆⁻, Y = Ph₂I⁺Cl⁻ | | | | |
|---|---|---|---|---|---|
| | Additions to Main Coat | | Additions to PVA Top Coat | Sensitivity in Steps | |
| Sample | X | Y | | Fresh | Accelerated Aging |
| 15 | 3 mg/g | 0 | None | 9 | 8 |
| 16 | 6 mg/g | 0 | None | 9 | 9 |
| 17 | 3 mg/g | 0 | X 2.5 mg/g | 10 | 9 |
| 18 | 0 | 0 | X 2.5 mg/g | 9 | 8 |
| 19 | 0 | 0 | X 5.0 mg/g | 10 | 9 |
| 20 | 0 | 3 mg/g | None | 8 | 6 |
| 21 | 0 | 0 | Y 2.5 mg/g | 7 | 6 |
| 22 | 3 mg/g | 0 | Y 2.5 mg/g | 10 | 7 |
| 23 | 3 mg/g | 3 mg/g | None | 8 | 6 |

It is seen that additions to the topcoat give improvement in both speed and stability (samples 15, 16, and 17). Initiator in the topcoat alone was as effective as divided additions (18,19), and a second photoinitiator with a different performance shows similar improvements using topcoat additions.

I claim:

1. A photopolymerizable assembly comprising a substrate with at least two layers over a surface of said substrate, wherein a lower layer of said two layers comprises a free radically polymerizable compound containing at least one ethylenically unsaturated double bond, and an oxygen top oxygen barrier layer of said two layers comprises a barrier polymeric binder and a first photoinitiator for free radical polymerization.

2. An assembly as recited in claim 1 wherein said top layer further comprises a sensitizer for said photoinitiator.

3. An assembly as recited in claim 1 wherein said lower layer further comprises a second photo-initiator for free radical polymerization which is the same compound or a different compound from the first photoinitiator in said oxygen barrier layer.

4. An assembly as recited in claim 1 wherein said lower layer further comprises a film-forming polymeric binder.

5. An assembly as recited in claim 3 wherein said lower layer further comprises a film-forming polymeric binder.

6. An assembly as recited in claim 3 wherein said lower layer further comprises a sensitiser.

7. An assembly as recited in claim 3 wherein said second photoinitiator is present in an amount at least 25 mole % of said first photoinitiator.

8. An assembly as recited in claim 1 wherein said first photoinitiator is selected from the group consisting of organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydroazones, mercapto compounds, pyrilium compounds, triarylimidazoles, biimidazoles, and haloalkyl-triazines.

9. An assembly as recited in claim 3 wherein said second photoinitiator is selected from the group consisting of organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydroazones, mercapto compounds, pyrilium compounds, triarylimidazoles, biimidazoles, and haloalkyl-triazines.

10. An assembly as recited in claim 1 wherein said first photoinitiator is selected from aromatic iodonium salts with the general structures

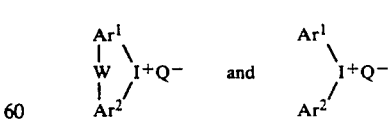

wherein
Ar¹ and Ar² are aromatic groups having from 4 to 20 carbon atoms and are preferably selected from phenyl, naphthyl, thienyl, furanyl and pyrazolyl groups,
W is selected from a single bond, =O, =S, =S=O, =C=O,

and $=N-R^{13}$, $=CR^{14}R^{15}$ where $R^{13}$ is aryl of 6 to 20 carbon atoms, acyl of 2 to 20 carbon atoms, and where $R^{11}$ and $R^{12}$ are selected from hydrogen, and alkyl groups of 1 to 4 carbon atoms, Q is an anion.

11. An assembly as recited in claim 3 wherein said second photoinitiator is selected from aromatic iodonium salts with the general structures

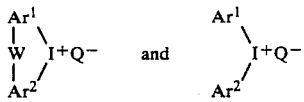

wherein
Ar$^1$ and Ar$^2$ are aromatic groups having from 4 to 20 carbon atoms and are preferably selected from phenyl, naphthyl, thienyl, furanyl and pyrazolyl groups, W is selected from a single bond, $=O$, $=S$, $=S=O$, $=C=O$,

$=N-R^{13}$, and $=CR^{11}R^{12}$ where $R^{13}$ is aryl of 6 to 20 carbon atoms, acyl of 2 to 20 carbon atoms, and where $R^{11}$ and $R^{12}$ are selected from hydrogen, and alkyl groups of 1 to 4 carbon atoms, Q is an anion.

12. An assembly as recited in claim 10 or claim 11 wherein said anion is selected from chloride, acetate, tetraborate, hexafluorophosphate, hexafluoroarsenate, and hexafluoroantimonate.

13. An assembly as recited in claim 1 wherein said first photoinitiator is selected from diphenyliodonium hexafluorophosphate, diphenyliodonium chloride, and p-methoxydiphenyliodonium acetate.

14. An assembly as recited in claim 3 wherein said second photoinitiator is selected from diphenyliodonium hexafluorophosphate, diphenyliodonium chloride, and p-methoxydiphenyliodonium acetate.

15. An assembly as recited in claim 1 wherein said first photoinitiator is a haloalkyltriazine selected from those having the general structure

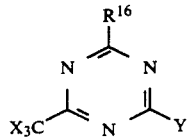

wherein,
X is a halogen atom,
Y is $-CX_3$, $-NH_2$, $-NHR^{15}$, $NU^{15}{}_2$, or $-OR^{15}$, wherein $R^{15}$ is an alkyl group of 1 to 4 carbon atoms or an aryl group containing 6 to 10 carbon atoms, and $R^{16}$ is $-CX_3$, an alkyl group of 1 to 12 carbon atoms, an aryl group of 6 to 12 carbon atoms, an alkenyl group of 2 to 12 carbon atoms, or an aralkenyl group containing from 8 to 20 carbon atoms.

16. An assembly as recited in claim 3 wherein said second photoinitiator is a haloalkyltriazine selected from those having the general structure

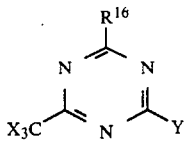

wherein,
X is a halogen atom,
Y is $-CX_3$, $-NH_2$, $-NHR^{15}$, $NR^{15}{}_2$, or $-OR^{15}$, wherein $R^{15}$ is an alkyl group of 1 to 4 carbon atoms or an aryl group containing 6 to 10 carbon atoms,
and $R^{16}$ is $-CX_3$, an alkyl group of 1 to 12 carbon atoms, an aryl group of 6 to 12 carbon atoms, an alkenyl group of 2 to 12 carbon atoms, or an aralkenyl group containing from 8 to 20 carbon atoms.

17. An assembly as recited in claim 2 wherein said lower layer further comprises a p-substituted-N-disubstituted-aniline.

18. An assembly as recited in claim 6 wherein said lower layer further comprises a p-substituted-N-disubstituted-aniline.

19. An assembly as recited in claim 17 wherein said p-substituted-N-disubstituted-aniline is selected from those with the general structure

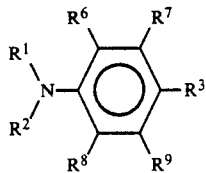

wherein,
$R^1$ and $R^2$ are the same or different and are each alkyl containing from 1 to 12 carbon atoms, or together with a nitrogen atom they form one or more hetrocyclic rings having from 5 to 10 nuclear atoms,
$R^3$ is the group $-COOR^4$ or the group $-(C=O)-R^5$,
$R^4$ is H, alkyl, hydroxyalkyl, carboxyyalkyl, aralkyl, or aryl, where alkyl has from 1 to 15 carbon atoms, and aryl is phenyl or naphthyl,
$R^5$ is H, alkyl containing from 1 to 4 carbon atoms, phenyl, or naphthyl,
$R^6$, $R^7$, $R^8$, $R^9$ are independently H, alkyl, hydroxy, alkoxy, halogen, cyano, or $R^6$ and $R^7$ together or $R^{6'}$ and $R^{7'}$ together may independently form cyclic structures containing up to 8 ring atoms.

20. A photopolymerizable assembly comprising a substrate with at least two layers over a surface of said substrate, wherein a lower layer of said two layers comprises a free radically polymerizable compound containing at least one ethylenically unsaturated double bond, and a top oxygen barrier layer of said two layers consists essentially of an oxygen barrier polymeric binder and a first photoinitiator for free radical polymerization.

21. An assembly as recited in claim 20 wherein said top layer further comprises a sensitizer for said photoinitiator.

22. An assembly as recited in claim 20 wherein said lower layer further comprises a second photoinitiator for free radical polymerization.

23. An assembly as recited in claim 20 wherein said lower layer further comprises a film-forming polymeric binder.

24. An assembly as recited in claim 20 wherein said second photoinitiator is present in an amount at least 25 mole % of said first photoinitiator.

25. An assembly as recited in claim 20 wherein said first photoinitiator is selected from the group consisting of organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydroazones, mercapto compounds, pyrilium compounds, triarylimidazoles, biimidazoles, and haloalkyl-triazines.

26. An assembly as recited in claim 20 wherein said second photoinitiator is selected from the group consisting of organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydroazones, mercapto compounds, pyrilium compounds, triarylimidazoles, biimidazoles, and haloalkyl-triazines.

27. An assembly as recited in claim 20 wherein said second photoinitiator is selected from aromatic iodonium salts with the general structures

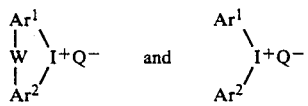

wherein

Ar$^1$ and Ar$^2$ are aromatic groups having from 4 to 20 carbon atoms and are preferably selected from phenyl, naphthyl, thienyl, furanyl and pyrazolyl groups, W is selected from a single bond, $=$O, $=$S, $=$S$=$O, $=$C$=$O,

$=$N—R$^{13}$, and CR$^{11}$R$^{12}$ where R$^{13}$ is aryl of 6 to 20 carbon atoms, acyl of 2 to 20 carbon atoms, and where R$^{11}$ and R$^{12}$ are selected from hydrogen, and alkyl groups of 1 to 4 carbon atoms, Q is an anion wherein said anion is selected from chloride, acetate, tetraborate, hexafluorophosphate, hexafluoroarsenate, and hexafluoroantiomonate.

28. An assembly as recited in claim 20 wherein said first photoinitiator is a haloalkyltriazine selected from those having the general structure

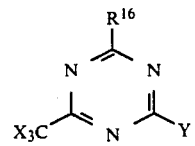

wherein,

X is a halogen atom,

Y is —CX$_3$, —NH$_2$, —NHR$^{15}$, —NR$^{15}$$_2$, or —OR$^{15}$, wherein R$^{15}$ is an alkyl group of 1 to 4 carbon atoms or an aryl group containing 6 to 10 carbon atoms, and R$^{16}$ is —CX$_3$, and alkyl group of 1 to 12 carbon atoms, an aryl group of 6 to 12 carbon atoms, an alkenyl group of 2 to 12 carbon atoms, or an aralkenyl group containing from 8 to 20 carbon atoms.

29. A photopolymerizable assembly comprising a substrate with at least two layers over a surface of said substrate, wherein a lower layer of said two layers comprises a free radically polymerizable compound containing at least one ethylenically unsaturated double bond, and a top oxygen barrier layer of said two layer comprises an oxygen barrier polymeric binder and a first photoinitiator for free radical polymerization said oxygen barrier layer having no free radical polymerizable compounds therein.

30. An assembly as recited in claim 29 wherein said top layer further comprises a sensitizer for said photoinitiator.

31. An assembly as recited in claim 29 wherein said lower layer further comprises a second photoinitiator for free radical polymerization.

32. An assembly as recited in claim 29 wherein said lower layer further comprises a film-forming polymeric binder.

33. An assembly as recited in claim 29 wherein said second photoinitiator is present in an amount at least 25 mole % of said first photoinitiator.

34. An assembly as recited in claim 29 wherein said first photoinitiator is selected from the group consisting of organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydroazones, mercapto compounds, pyrilium compounds, triarylimidazoles, biimidazoles, and haloalkyl-triazines.

35. An assembly as recited in claim 29 wherein said second photoinitiator is selected from the group consisting of organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydroazones, mercapto compounds, pyrilium compounds, triarylimidazoles, biimidazoles, and haloalkyl-triazines.

36. An assembly as recited in claim 29 wherein said second photoinitiator is selected from aromatic iodonium salts with the general structures

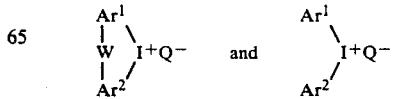

wherein
Ar¹ and Ar² are aromatic groups having from 4 to 20 carbon atoms and are preferably selected from phenyl, naphthyl, thienyl, furanyl and pyrazolyl groups, W is selected from a single bond, =O, =S, =S=O, =C=O,

=N—R¹³, and CR¹¹R¹² where R¹³ is aryl of 6 to 20 carbon atoms, acyl of 2 to 20 carbon atoms, and where R¹¹ and R¹² are selected from hydrogen, and alkyl groups of 1 to 4 carbon atoms, Q is an anion wherein said anion is selected from chloride, acetate, tetraborate, hexafluorophosphate, hexafluoroarsenate, and hexafluoroantimonate.

37. An assembly as recited in claim 29 wherein said first photoinitiator is a haloalkyltriazine selected from those having the general structure

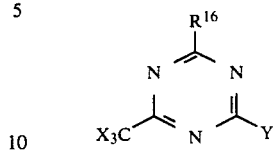

wherein,
X is a halogen atom,
Y is —CX₃, —NH₂, —NHR¹⁵, —NR¹⁵₂, or —OR¹⁵, wherein R¹⁵ is an alkyl group of 1 to 4 carbon atoms or an aryl group containing 6 to 10 carbon atoms, and
R¹⁶ is —CX₃, and alkyl group of 1 to 12 carbon atoms, an aryl group of 6 to 12 carbon atoms, an alkenyl group of 2 to 12 carbon atoms, or an aralkenyl group containing from 8 to 20 carbon atoms.

* * * * *

UNITED STATES PATENT AND TRADEMARK OFFICE
CERTIFICATE OF CORRECTION

PATENT NO. : 4,988,607

DATED : January 29, 1991

INVENTOR(S) : Ali

It is certified that error appears in the above-identified patent and that said Letters Patent is hereby corrected as shown below:

Col. 2, line 53, Insert --several-- after "lists"

Col. 2, line 53, Replace "photoseveral" with --photo--

Col. 9, line 60, Replace "/2" with -- _/2 --

Col. 13, line 65, Replace "$NU^{15}_2$" with -- $-NR^{15}_2$ --

Col. 14, line 18, Replace "$NR^{15}_2$" with -- $-NR^{15}_2$ --

Signed and Sealed this

Eighteenth Day of May, 1993

Attest:

MICHAEL K. KIRK

*Attesting Officer*   Acting Commissioner of Patents and Trademarks